United States Patent [19]
Johnson et al.

[11] Patent Number: 5,917,709
[45] Date of Patent: Jun. 29, 1999

[54] MULTIPLE CIRCUIT BOARD ASSEMBLY HAVING AN INTERCONNECT MECHANISM THAT INCLUDES A FLEX CONNECTOR

[75] Inventors: Dean A. Johnson, Churchville; William R. Laubengayer, Kendall; Stephen G. Richardson, Fairport, all of N.Y.

[73] Assignee: Eastman Kodak Company, Rochester, N.Y.

[21] Appl. No.: 08/876,376

[22] Filed: Jun. 16, 1997

[51] Int. Cl.⁶ ..................................... H05K 1/11
[52] U.S. Cl. ............... 361/803; 361/742; 361/749; 361/751; 361/767; 361/777; 361/789; 361/790; 361/804; 174/254; 174/268; 174/138 G; 439/67; 439/74; 439/591
[58] Field of Search .................. 361/749, 751, 361/789, 803, 767, 770, 790, 804, 742, 777; 174/138 G, 254, 268; 439/67, 69, 74, 77, 329, 591

[56] References Cited

U.S. PATENT DOCUMENTS

| | | | |
|---|---|---|---|
| 2,848,568 | 8/1958 | Berkeley et al. | 439/74 |
| 3,967,162 | 6/1976 | Ceresa et al. | 361/751 |
| 3,971,127 | 7/1976 | Giguere et al. | 174/254 |
| 4,012,093 | 3/1977 | Crane | 439/67 |
| 4,057,311 | 11/1977 | Evans | 439/66 |
| 4,116,517 | 9/1978 | Selvin et al. | 439/67 |
| 4,453,795 | 6/1984 | Moulin | 439/67 |
| 4,587,596 | 5/1986 | Bunnell | 361/749 |
| 4,636,018 | 1/1987 | Stillie | 439/66 |
| 4,689,721 | 8/1987 | Damerow et al. | 439/67 |
| 4,828,512 | 5/1989 | McCormick et al. | 439/67 |
| 4,859,189 | 8/1989 | Petersen et al. | 439/66 |
| 4,911,644 | 3/1990 | Bond et al. | 439/67 |
| 4,948,374 | 8/1990 | Carter | 439/67 |
| 4,988,306 | 1/1991 | Hopfer, III et al. | 439/66 |
| 4,991,290 | 2/1991 | MacKay | 439/67 |
| 5,007,842 | 4/1991 | Deak et al. | 439/66 |
| 5,018,005 | 5/1991 | Lin et al. | 257/730 |
| 5,126,920 | 6/1992 | Cardashian | 361/749 |
| 5,165,984 | 11/1992 | Schenthaler | 428/209 |
| 5,219,293 | 6/1993 | Imamura | 437/67 |
| 5,254,016 | 10/1993 | Ganthier | 439/567 |
| 5,267,043 | 11/1993 | Rottner et al. | 348/104 |
| 5,315,481 | 5/1994 | Smolley | 361/707 |
| 5,321,583 | 6/1994 | McMahon | 361/770 |
| 5,334,029 | 8/1994 | Akkapeddi et al. | 439/66 |
| 5,340,318 | 8/1994 | Kunihiro | 439/66 |
| 5,435,734 | 7/1995 | Chow | 439/69 |
| 5,471,368 | 11/1995 | Downie et al. | 361/760 |
| 5,473,510 | 12/1995 | Dozier, II | 361/719 |
| 5,528,462 | 6/1996 | Pendse | 361/767 |
| 5,619,399 | 4/1997 | Mok | 361/707 |
| 5,642,055 | 6/1997 | Difrancesco | 361/785 |
| 5,801,925 | 9/1998 | Fonts | 361/803 |

FOREIGN PATENT DOCUMENTS 02-112280  4/1990  Japan ............... H01L 27/14

*Primary Examiner*—Leo P. Picard
*Assistant Examiner*—John B. Vigushin
*Attorney, Agent, or Firm*—James D. Leimbach

[57] ABSTRACT

A multiple circuit board assembly comprising: a first circuit board having a first predetermined set of conductive traces on a surface; a second circuit board having a second predetermined set of conductive traces on a surface; an interconnect mechanism having a third set of traces that mate the first and second set of traces when sandwiched between the first circuit board and the second circuit board in a predetermined manner; and fastened to the first and second circuit boards together with the interconnect mechanism sandwiched between such that there is electrical contact between the first and second predetermined set of conductive traces. The interconnect mechanism can be either single sided flex connector cable, double sided flex connector cable, or Cinch connectors. The fastening mechanism can be snaps fittings or screw setups without or without resilient washers.

14 Claims, 9 Drawing Sheets

MULTIPLE CIRCUIT BOARD ASSEMBLY HAVING AN INTERCONNECT MECHANISM THAT INCLUDES A FLEX CONNECTOR

CROSS-REFERENCE TO RELATED APPLICATIONS

The present application is related to U.S. application Ser. No. 08/876,634, filed Jun. 16, 1997, by Peter Zepetella et al., and entitled, "Circuit Board Standoff", U.S. application Ser. No. 08/876,633, filed Jun. 16, 1997 by Bryan Beaman, et al., and entitled "Imager Packaging Substrate.", U.S. application Ser. No. 08/876,453, filed Jun. 16, 1997, by Dean Johnson and entitled, "Packaging of Imaging Devices Assembly," and U.S. application Ser. No. 08/876,456, filed Jun. 16, 1997 by Bryan Beaman et al., and entitled "Integrated Imaging Head."

FIELD OF THE INVENTION

The present invention relates generally to the field of electronic imaging and in particular to an inexpensive process for attaching a first and second circuit boards together.

BACKGROUND OF THE INVENTION

There are numerous prior art disclosures illustrating the assembly of multiple circuit boards. Among these are teachings of methods to assemble multiple circuit boards employing solder paste as well as methods of assembling circuit boards using various attachment mechanisms including flexible interconnect embodiments and various assemblies employing conventional hardware such as screws or snapping devices.

FIG. 1 is a diagram of a prior art Solder Interconnect Assembly design. A typical disclosure of such a device is given in U.S. Pat. No. 5,471,368 issued to Downie et al. (Downie). FIGS. 2 and 3 illustrate the individual mother and daughter boards that are soldered together in such an embodiment.

FIG. 2 is an illustration of a prior art Mother Board Design layout. The mother board layout is designed to incorporate the same test features as with the mechanical boards. This includes continues monitoring of continuity during each test and determination of actual interconnect resistance. This board will be a single sided 0.047 inch thick FR-4 board with 1 ouncecopper traces. Solder mask will cover all traces except the interconnect geometries and test pads. Surface finish over exposed pads will be Hot Air Solder Leveled (HASL) as this will most probably be used in a production mother board. The diagram in FIG. 2 represents the mother board layout.

FIG. 3 is a Scalloped Edge Daughter Board Design layout. The daughter boards are designed to provide electrical continuity throughout the test vehicles when soldered to the mother boards. The boards will be double sided 0.047 inch thick FR-4 with 1 ounce copper traces. All conductors will be plated with soft wirebonable gold over nickel. Plate through holes located at the board edge will be routed through to form edge receptacles (scallops) for the solder. Solder mask will cover all traces except the interconnect geometry. FIG. 3a and FIG. 3b represents the daughter board layout. FIG. 3a shows the secondary side and FIG. 3b shows the primary side.

A problem exists within the prior art that is especially apparent in assemblies used to house semiconductor based image sensors. These image sensors are sensitive to high temperatures. Therefore, the solder based assembly described above is difficult to assemble without damage to the image sensor device. Certain electronic components such as charge-coupled devices (CCDs) or other imaging sensors, have low temperature requirements. These devices can not be assembled to printed circuit boards using traditional re-flow techniques primarily due to the temperature sensitivity of microlenslets and Color Filter Arrays currently used. As sensor packaging migrates to more integrated imaging heads, there is a need for a relatively low temperature, high volume, inexpensive process to attach an imaging head substrate to a product driver board.

Typically tests vehicles for solder assemblies will use hot nitrogen to reflow the solder during the interconnect process. Screen paste will be stenciled down onto the mother board and reflowed using standard SMT methods. Four stencil layouts with different sized openings will allow tests to determine the proper solder volume for quality solder joints. The mother board will be placed onto a fixture plate followed by the daughter board. Hot nitrogen will be directed to the solder pads only through a custom nozzle. This will cause the solder to reflow and wick up the scalloped edges on the daughter board completing the electrical interconnect. Flux may have to be applied prior to reflow to ensure quality solder joints. This is a time consuming method for assembly of mother/daughter board configurations.

Other assemblies employ flexible interconnects, such as U.S. Pat. No. 5,007,842, issued to Deak et al (Deak). This prior art device is appropriate to use for solid state image sensor assemblies in terms of high temperature protection, however requires plates with slots and coil springs while makes the assembly costly.

From the foregoing discussion is should be apparent that there remains a need within the art for cost effective assembly that can effectively attach mother and daughter boards that provides a low temperature solution with high volume capabilities.

SUMMARY OF THE INVENTION

The present invention is directed to overcoming one or more of the problems set forth above. Briefly summarized, according to one aspect of the present invention, a multiple circuit board assembly comprising: a first circuit board having a first predetermined set of conductive traces on a surface; a second circuit board having a second predetermined set of conductive traces on a surface; an interconnect mechanism having a third set of traces that mate the first and second set of traces when sandwiched between the first circuit board and the second circuit board in a predetermined manner; and fastened to the first and second circuit boards together with the interconnect mechanism sandwiched between such that there is electrical contact between the first and second predetermined set of conductive traces. The interconnect mechanism can be either single sided flex connector cable, double sided flex connector cable, or Cinch connectors. The fastening mechanism can be snaps fittings or screw setups with or without resilient washers.

An imaging head substrate is attached to a product driver board. In the anticipated volumes, manual soldering would interrupt process flow and be a more costly solution. The present invention identifies a robust interconnect technique that is scaleable to other core modules. Using gang type interconnect concepts, it is anticipated this project will deliver higher reliability, less expensive options with higher first time yield than current methods.

These and other aspects, objects, features, and advantages of the present invention will be more clearly understood and appreciated from a review of the following detailed description of the preferred embodiments and appended claims, and by reference to the accompanying drawings.

Advantageous Effect Of The Invention

Cost savings (total system cost) result from having a product that can be mass produced at less cost, has higher reliability and has higher first time yields.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

From the foregoing discussion is should be apparent that there remains a need within the art for cost effective assembly that can effectively attach mother and daughter boards and provides a low temperature solution with high volume capabilities.

Figure 4:
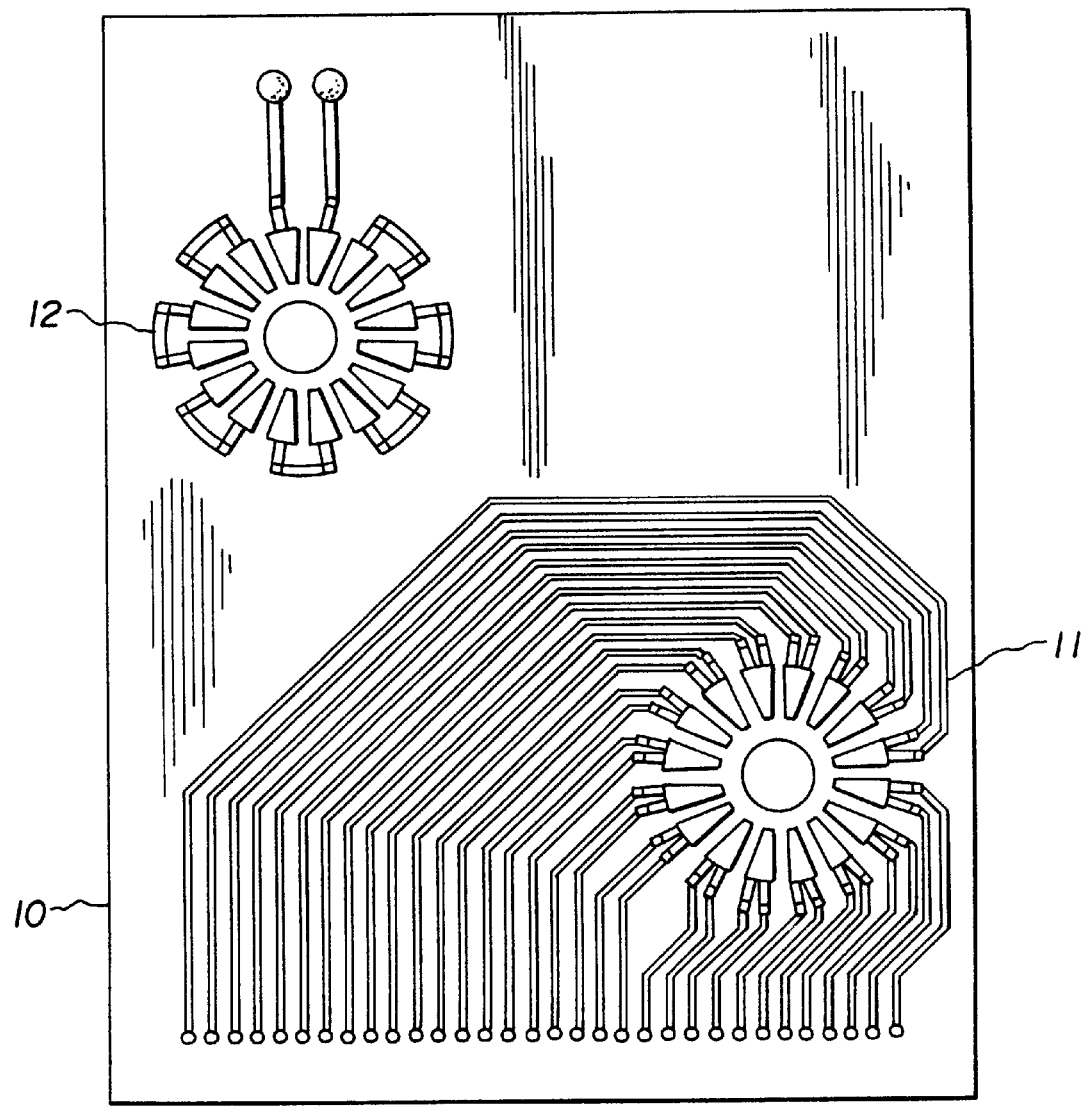
FIG. 4 is a diagram of a mother board design.

Referring to FIG. 4, a diagram of the layout of a mother board 10 that is specifically designed to allow for continuous monitoring of interconnect integrity during testing of each phase of the assembly process. The design also allows for determination of actual interconnect resistance before and after each test. FIG. 4 represent the mother board 10 layout. As envisioned, the mother board 10 will made on a substrate that is a single sided 0.047" thick FR-4 with 1 ounce copper traces. The traces in the embodiment shown in FIG. 4 are arranged as first interconnect 11 and second interconnect 12. Both first and second interconnects 11, 12 are made from conductors that are plated with nickel and then soft wirebondable gold. Solder mask will cover all traces except the interconnect geometries and test pads.

Figure 1:
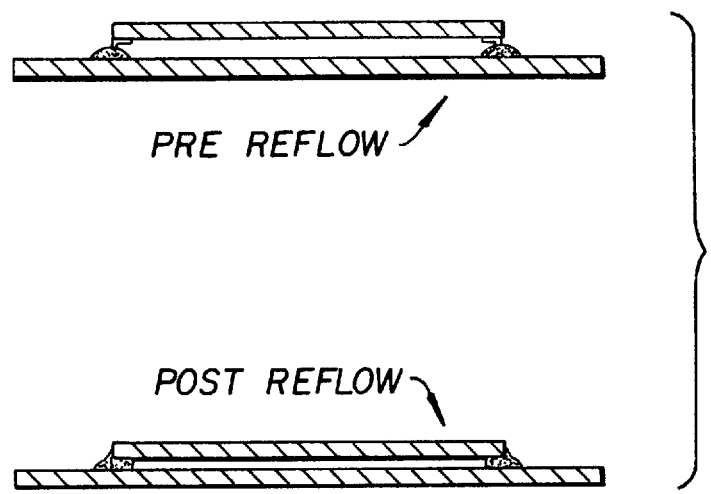
FIG. 1 is a diagram of a prior art Solder Interconnect Assembly design.
Figure 2:
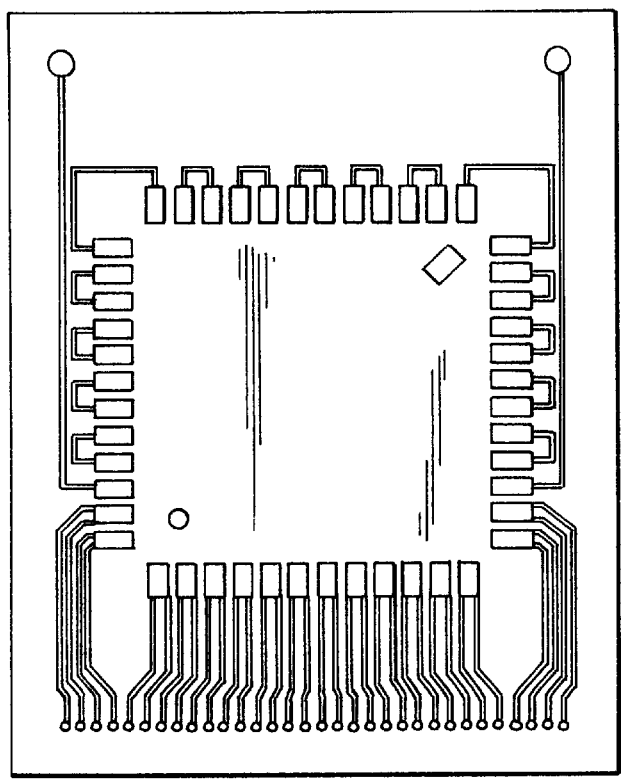
FIG. 2 is a typical prior art Mother Board Design layout for the assembly of FIG. 1.
Figure 3A:
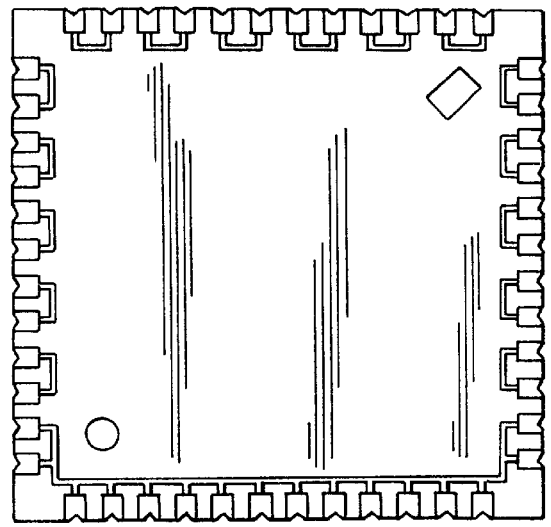
FIGS. 3A and 3B are different views of a typical prior art Scalloped Edge Daughter Board Design layout for the assembly of FIG. 1.
Figure 3B:
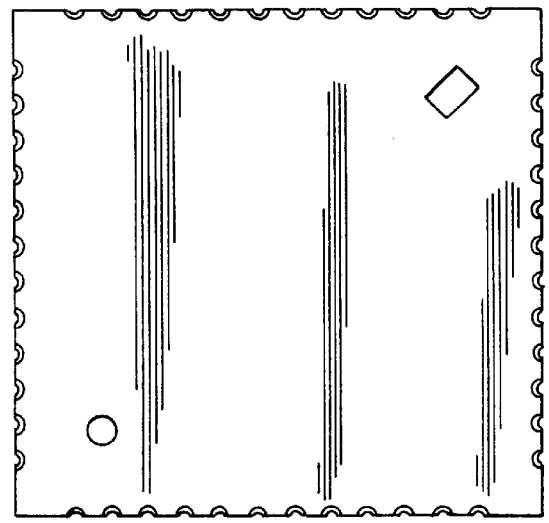
Figure 5:
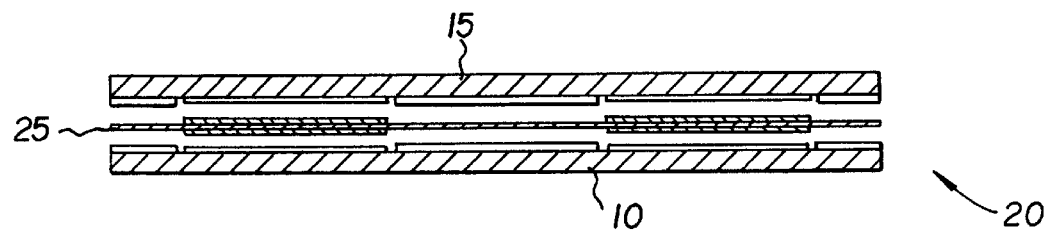
FIG. 5 is a diagram illustrating an APPS Connector and Double Sided Flex Interconnect layout.

FIG. 5 is a diagram illustrating the assembly 20 having motherboard 10, daughter board 15 and Double Sided Flex Interconnect 25. Within this embodiment of the invention, double flex connector 25 provides the electrical interface between mother board 10 and daughter board 15.

Figure 6:
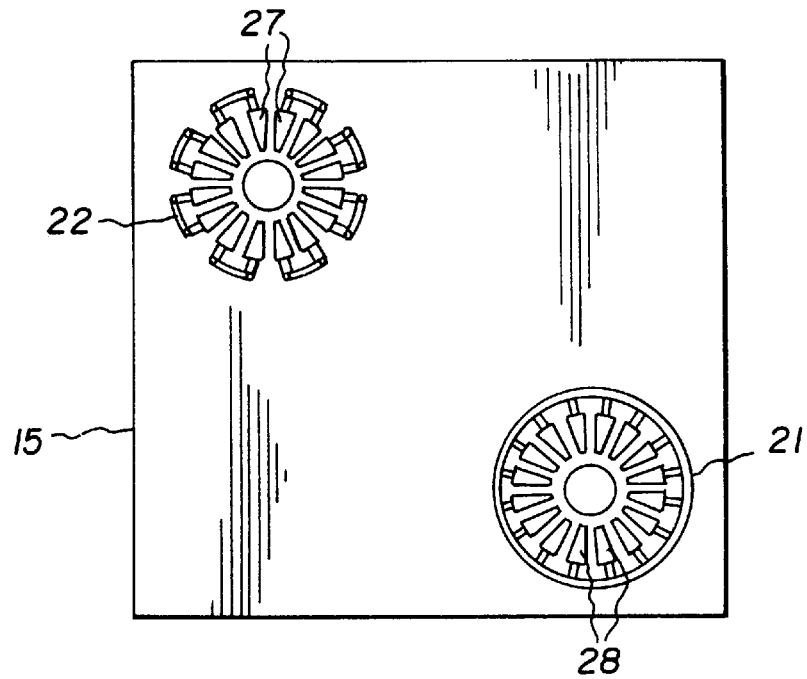
FIG. 6 is a diagram of daughter board design.

FIG. 6 is a diagram of a daughter board 15 as envisioned by the present invention. The daughter board 15 is designed to provide electrical continuity throughout the test vehicles when assembled using any of the 4 interconnect methods via conductive traces 21, 22 which respectively provide electrical connection to first and second traces 11, 12 discussed under the discussion for the mother board 10. Here, it is envisioned that the fiberglass version of the board (the FR-4 version) will be a single sided, 0.047" thick FR-4 board with 1 ounce copper traces used to create conductive traces 21, 22. All conductors will be plated with nickel and then soft wirebondable gold. Solder mask will cover all traces except the interconnect geometries 27, 28. The ceramic version of this board will be 0.025" thick and have wirebondable gold printed conductors. A dielectric layer (not shown) will be printed over all traces except the interconnect geometries 27, 28.

Figure 7:
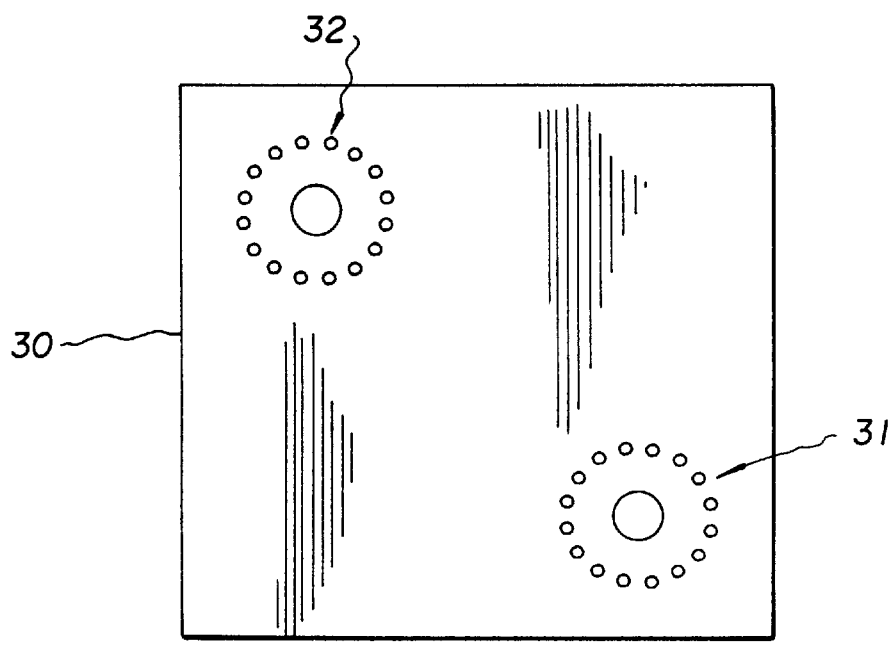
FIG. 7 is a diagram of a Cinch Connector Design layout.

FIG. 7 is a diagram of another connector 30 that can be used within the assembly shown in FIG. 5 to provide the electrical interface on double side flex interconnect 25 between the mother board 10 and the daughter board 15. The connector board 30 has interconnect geometries 31, 32 made by Cinch, conventionally referred to as a Cinn:APPS connector. The CIN:APPS connector is a custom connector manufactured by Cinch Co. It features buttons of randomly woven molybdenum wire formed into a specific shape and pressed into a custom insulating base. These buttons protrude from the base approximately 0.010 inches on each side. The base is custom molded of liquid crystal polymer for a particular design and can contain snaps or latching mechanisms to aid in final product assembly. Once assembled these connectors provide a highly reliable, low resistance electrical interconnect.

Figure 8:
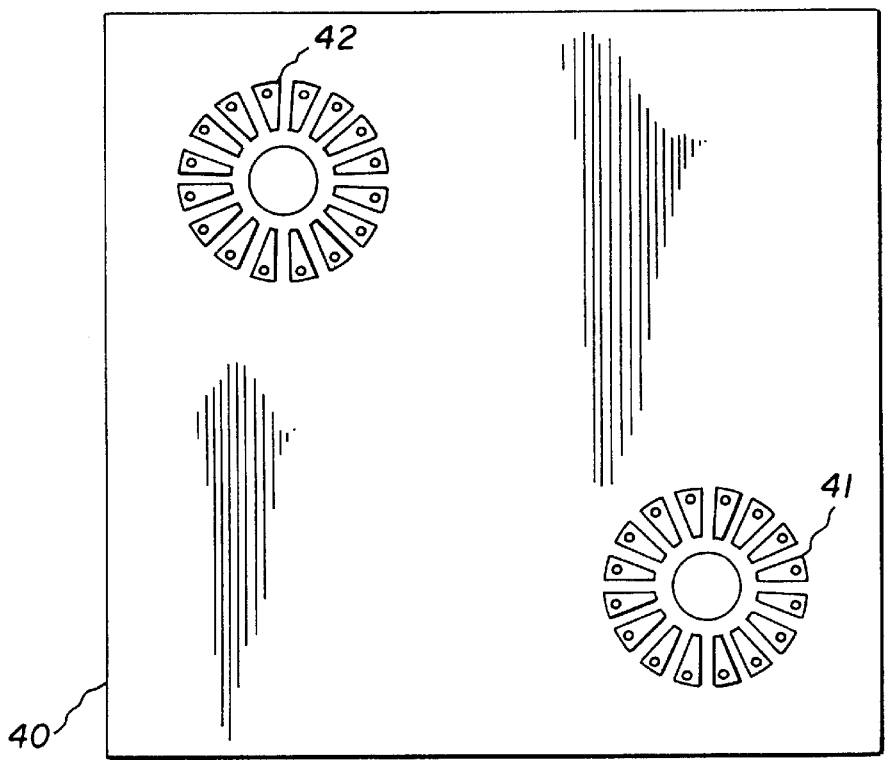
FIG. 8 is a Double Sided Flex Design layout.

FIG. 8 is an illustration of yet another connector 40 that can be used to provide the electrical interface on double side flex interconnect 25 between the mother board 10 and the daughter board 15 of FIG. 5. The connector 40 shown in FIG. 8 employs interconnect geometries 41, 42 made with a Double Sided Flex Design layout. The double sided flex circuits use the interconnect pad pattern of the mother/daughter boards. This pattern is located on both sides of a polymide base and each pad is through connected with a plated via (not shown). Copper traces will be 1 ounce rolled annealed copper with nickel and wirebonable gold plating. The final trace thickness will be greater than the solder mask thickness on the mother/daughter boards to ensure good electrical contact. There will be no coverlayer on these circuits.

Figure 9:
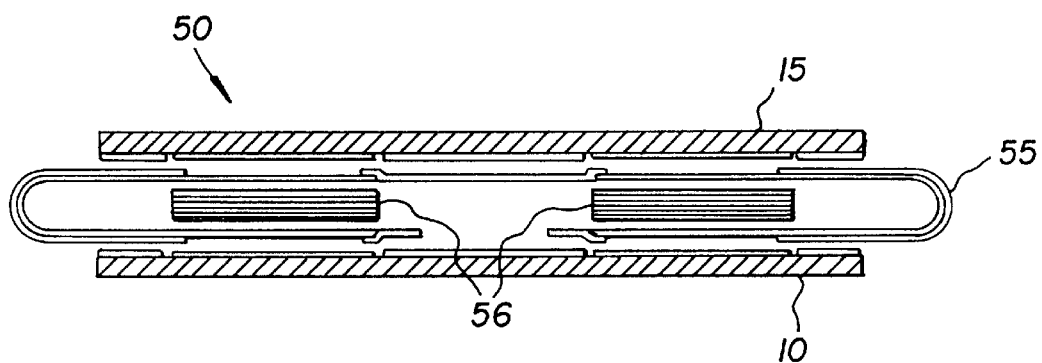
FIG. 9 is a Single Sided Flex Interconnect layout.

FIG. 9 is a diagram of an assembly 50 illustrating another embodiment of the invention employing a Single Sided Flex Interconnect 55. This illustrates the second method for interconnecting the mother board 10 and the daughter board 15 using a single sided flex circuit 55 in combination with a silicone rubber washer 56 to press the interconnect pads of the flex against the mother/daughter boards. This is a variation of interconnect methodology used in consumer products throughout the industry.

Figure 10:
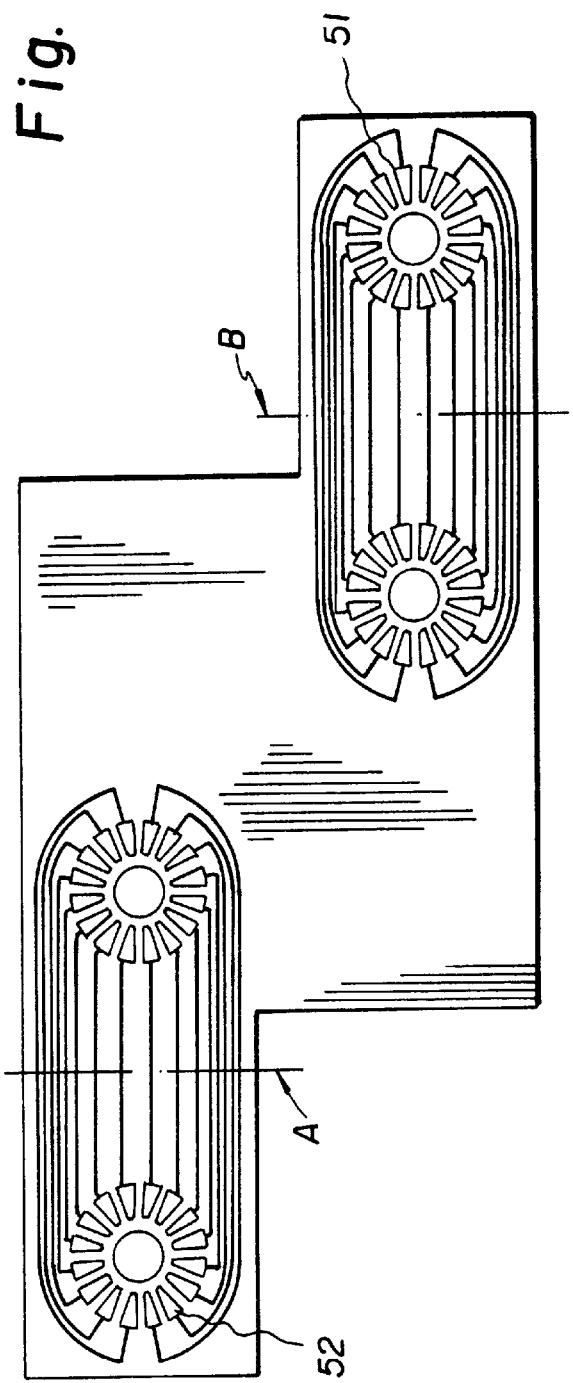
FIG. 10 is a Single Sided Flex Design layout.

FIG. 10 is a diagram that illustrates the design of the Single Sided Flex Interconnect 55 used in the assembly 50 of FIG. 9. The single sided flex circuit interconnect 55, uses the interconnect pad pattern that is placed on the mother board 10 and daughter board 15. This pattern, generally referred to as 51, 52, matches the pattern 11, 12, respectively on the mother board 10 as seen in FIG. 4 and patterns 21, 22 respectively on the daughter board 15 as seen in FIG. 5. Patterns 51, 52 are located on the primary side of a 0.001 inch thick polymide base. Copper traces will be 1 ounce rolled annealed copper with wirebondable gold over nickel plating. The coverlayer used is envisioned to be a 0.001 inch polymide film and cover all traces except for the interconnect pads. The diagram shown in FIG. 10 illustrate lines A and B where single sided flex board 55 is folded as shown in FIG. 9.

Figure 11:
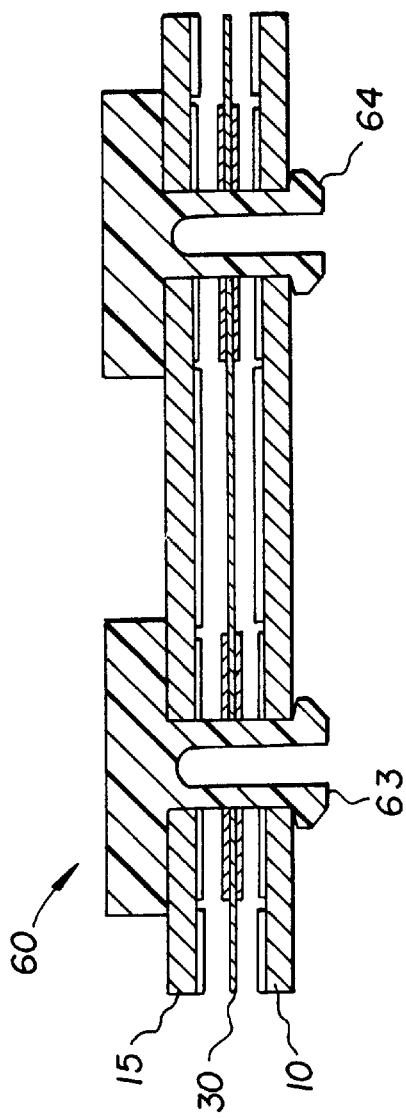
FIG. 11 is a diagram of a Snap Assembly design.

FIG. 11 is a diagram of a Snap Assembly 60 that employs Cinch:APPS Connector 30 used to electrically interface the interconnects on mother board 10 to daughter board 15. It has snap fittings 63, 64 used in conjunction with Cinch:APPS Connector 30 to provide a compressive force on all the interconnects.

Figure 12:
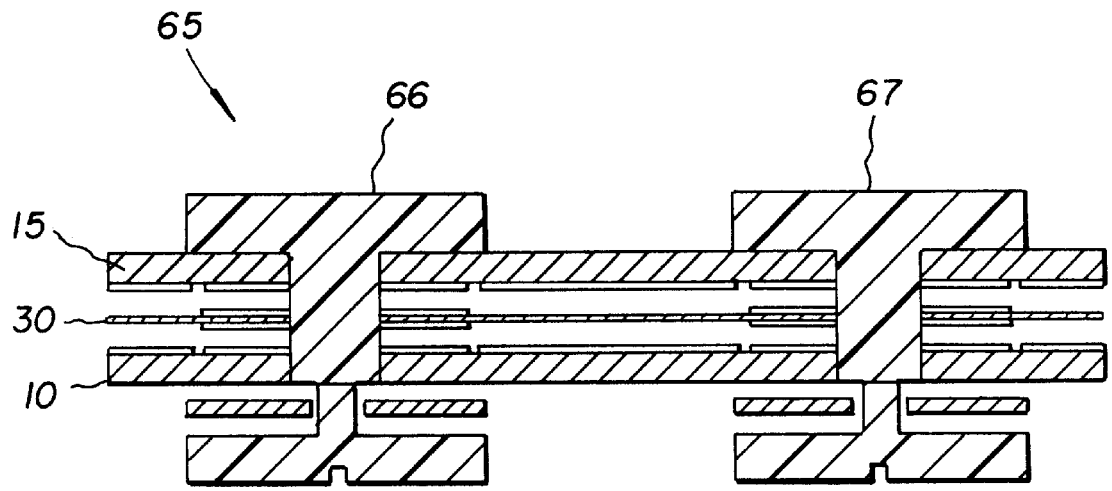
FIG. 12 is a diagram of a Screw & Washer Assembly design.

FIG. 12 is a diagram of a Screw & Washer Assembly 65 design that illustrates Cinch:APPS Connector 30 to provide the electrical interface between mother board 10 and daughter board 15. Screw fittings 66, 67 are employed without a washer to provide the compressive force upon the interconnects.

Figure 13:
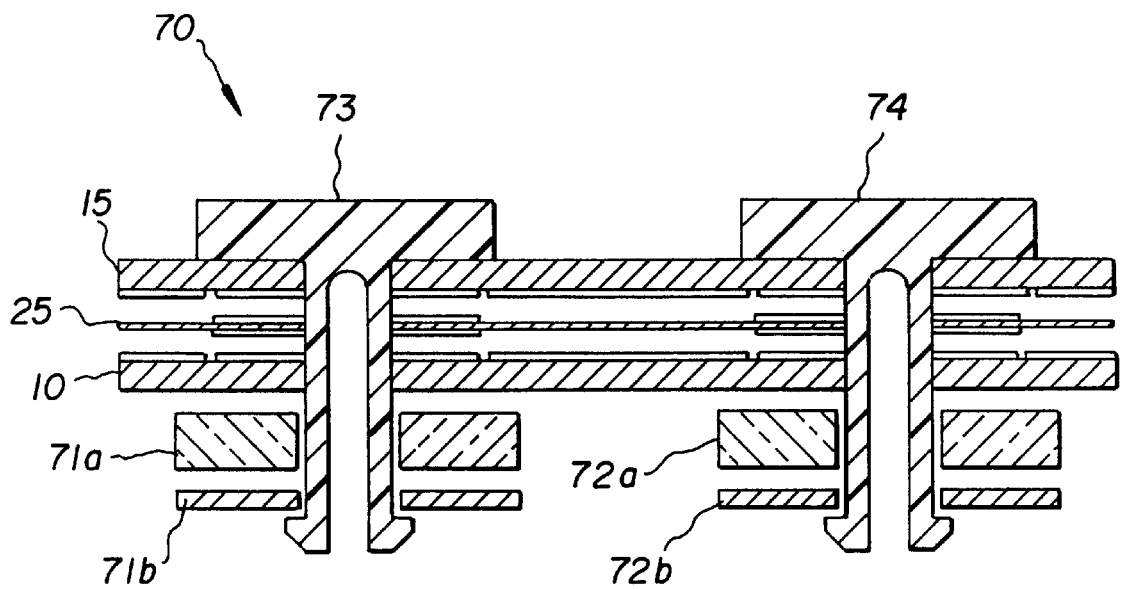
FIG. 13 is a diagram of a Snap Assembly with an Electronic Washer design.

FIG. 13 is a diagram of a Snap Assembly 70 within an Elastomeric Washer design that. It has double sided flex interconnect 25 provides the electrical interface between mother board 10 and daughter board 15 with elastomeric washers 71a, 72a backed with a metal washers 71b, 72b that are fastened with a snap fittings 73, 74. The elastomeric washers 71a, 72a provide the compressive force upon assembly 70.

Figure 14:
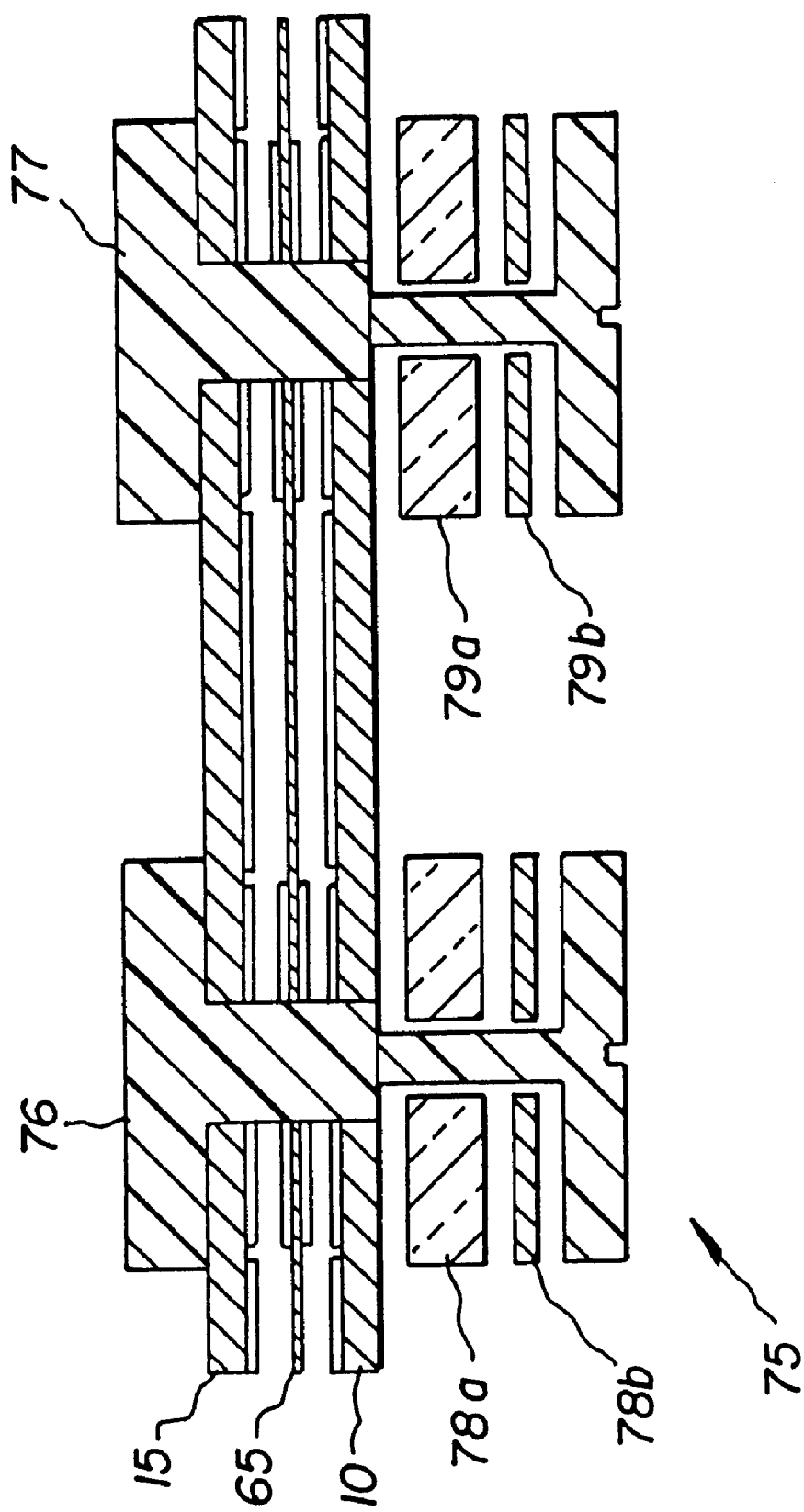
FIG. 14 is a diagram of a Screw & Washer Assembly with Elastomeric Washer design.

FIG. 14 is a diagram of a Screw & Washer Assembly 75 that employs an Elastomeric Washer design. Here, a double sided flex connector 25 is employed to provide the electrical interface between mother board 10 and daughter board 15. Screw assemblies 76, 77 are provided with elastomeric washers 78a, 79a backed with metal washers 78b, 79b. Again, elastomeric washers 78a, 79a provide the compressive force and the entire assembly 75 is fastened with screw fittings 76, 77.

Figure 15:
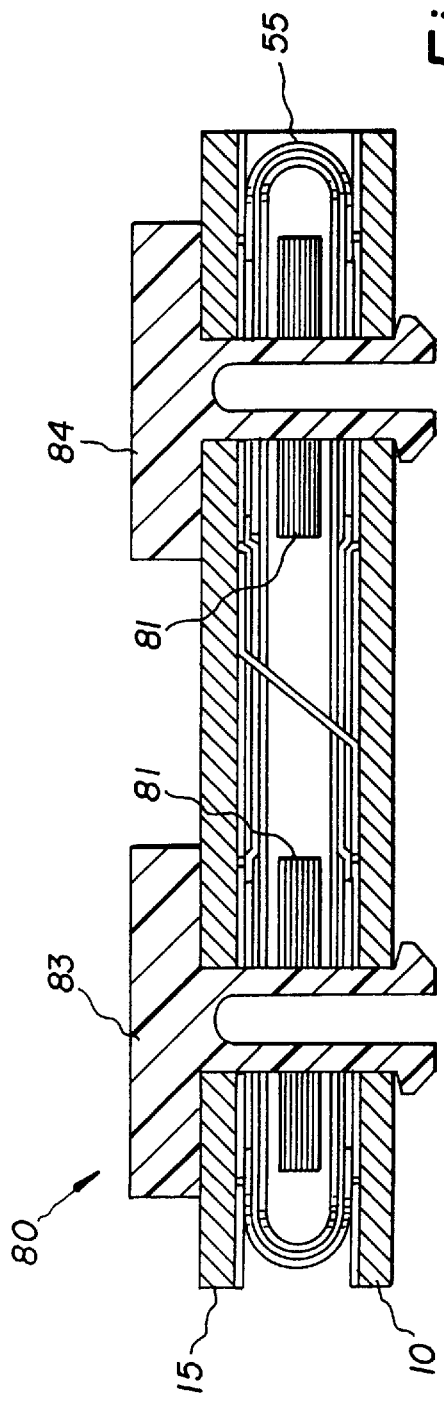
FIG. 15 is a diagram of a Snap Assembly with Elastomeric Washer design.

FIG. 15 is a diagram of a Snap Assembly 80 that employs a single layer flex interconnect 55 to provide the electrical interface between mother board 10 and daughter board 15. Elastomeric washers 81 insure proper spacing between the folded over sides of single layer flex interconnect 55. single sided flex connector 55 is fastened to mother board 10 and daughter board 15 with snap fittings 83, 84 that function in conjunction with elastomeric washers 81 in the center. Here, again, the elastomeric washer provides the compressive force.

Figure 16:
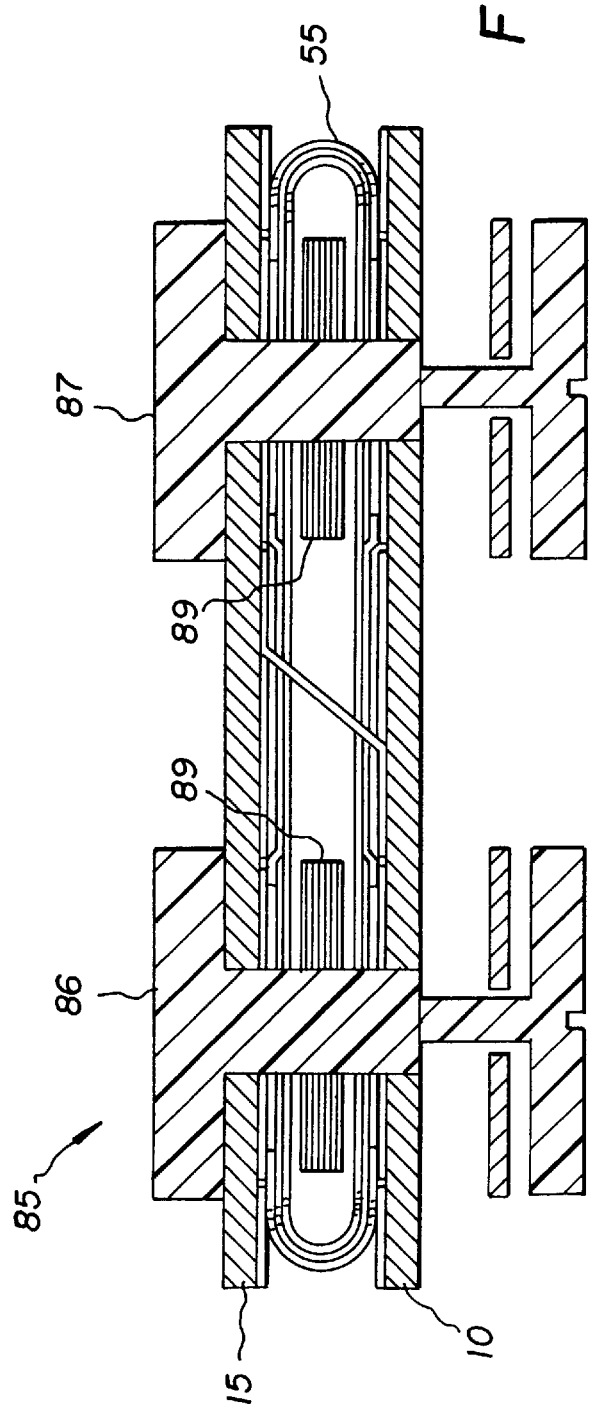
FIG. 16 is a diagram of a Screw & Washer Assembly with Elastomeric Washer design.

FIG. 16 is a diagram of a Screw & Washer Assembly 85 that employs a single sided flex connector 55 to provide the electrical interface between mother board 10 and daughter board 15. Elastomeric Washers 89 provided proper spacing for the folded over edges of single sided flex connector 55 while the entire assembly 85 is held together by screw fittings 86, 87. Again, the elastomeric washer provides the compressive force.

The invention has been described in detail with particular reference to certain preferred embodiments thereof, but it will be understood that variations and modifications can be effected within the spirit and scope of the invention.

PARTS LIST

10 mother board
11 first traces
12 second traces
15 daughter board
20 assembly
21 conductive trace
22 conductive trace
25 double sided flex interconnect
27 interconnect geometry
28 interconnect geometry
30 connector
31 interconnect geometries
32 interconnect geometries
40 assembly
41 interconnect geometry
42 interconnect geometry
50 single side flex assembly
51 pattern
52 pattern
55 single sided flex board
56 silicon washer
60 assembly
63 snap fitting
64 snap fitting
65 assembly
66 screw fitting
67 screw fitting
70 snap assembly
71a elastomeric washer
71b metal washer
72a elastomeric washer
72b metal washer
73 snap fitting
74 snap fitting
75 assembly
76 screw fitting
77 screw fitting
78a elastomeric washer
78b metal washer
79a elastomeric washer
79b metal washer
80 assembly
81 elastomeric washer
83 snap fitting
84 snap fitting
85 assembly
86 screw fitting
87 screw fitting
89 elastomeric washer

What is claimed is:

1. A multiple circuit board assembly comprising:

a first circuit board having a first predetermined set of conductive traces on a surface, the first set of conductive traces forming a first at least one arcuate pattern that is essentially symmetric about a first center;

a second circuit board having a second predetermined set of conductive traces on a surface, the second set of conductive traces forming a second at least one arcuate pattern that is essentially symmetric about a second center;

an interconnect mechanism having a third set of traces that mate the first and second at least one arcuate pattern of the first and second set of traces when held between the first circuit board and the second circuit board wherein the interconnect mechanism further comprises a single sided flex connector having a side with conductive material used to form the third set of traces, the single sided flex connector being wrapped such that the side with the third set of traces is facing both the first and second at least one arcuate pattern within the first and the second set of conductive traces; and means for fastening the first and second circuit boards together with the interconnect mechanism held between the first circuit board and the second circuit board such that there is electrical contact between the first and second predetermined set of conductive traces.

2. The assembly of claim 1 wherein the single sided flex connector has a mating set of electrical traces that mates with both the first and second set of conductive traces when the single sided flex connector is wrapped in a predetermined manner.

3. The assembly of claim 2 further comprising a resilient washer in juxtaposition to press the single sided flex interconnect against the first and second circuit boards.

4. The assembly of claim 1 wherein the interconnect mechanism is a double sided flex connector having conductive traces on both sides such that when sandwiched between the first and second circuit boards an electrical interface is provided between the first and second circuit boards.

5. The assembly of claim 4 wherein the first and second circuit boards are electrically interfaced by the double sided flex connector and fastened together with a snap mechanism.

6. The assembly of claim 5 further comprising a washer set up used in conjunction with the snap that includes at least an elastomeric washer.

7. The assembly of claim 4 wherein the board, the double sided flex connector is fastened between the first and second circuit boards with at least one screw set up.

8. The assembly of claim 7 further comprising a washer set up used in conjunction with the screw set up that includes at least an elastomeric washer.

9. The assembly of claim 1 wherein the interconnect mechanism further comprises the third set of traces including a series of patterned conductive wads formed on a substrate such that when sandwiched between the first and second circuit boards an electrical interface is provided between the first and second circuit boards.

10. The assembly of claim 9 wherein the first and second circuit boards are electrically interfaced by the patterned conductive wads with a snap mechanism.

11. The assembly of claim 10 further comprising a washer set up used in conjunction with the patterned conductive wads that includes at least an elastomeric washer.

12. The assembly of claim 9 wherein the first and second circuit boards, are fastened with the patterned conductive wads sandwiched in between with at least one screw set up.

13. The assembly of claim 12 further comprising a washer used in conjunction with the screw set up.

14. The assembly of claim 13 wherein the washer further comprises an elastomeric washer.

* * * * *

UNITED STATES PATENT AND TRADEMARK OFFICE
CERTIFICATE OF CORRECTION

PATENT NO. : 5,917,709
DATED : June 29, 1999
INVENTOR(S) : Dean A. Johnson, et. al.

It is certified that error appears in the above-identified patent and that said Letters Patent is hereby corrected as shown below:

Column 5, line 23, should reas follows: Elastomeric Washer design that has double sided flex--.

Signed and Sealed this

Fourteenth Day of November, 2000

Attest:

Q. TODD DICKINSON

*Attesting Officer*  *Director of Patents and Trademarks*